(12) United States Patent
Thomson

(10) Patent No.: US 6,278,293 B1
(45) Date of Patent: Aug. 21, 2001

(54) CIRCUIT AND METHOD FOR A TRANSISTOR-TRANSISTOR LOGIC (TTL) COMPATIBLE OUTPUT DRIVE

(75) Inventor: Robert G. Thomson, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 09/458,736

(22) Filed: Dec. 13, 1999

(51) Int. Cl.[7] .............................................. H03K 19/0175
(52) U.S. Cl. ................................ 326/67; 326/83; 326/74; 326/75; 327/170
(58) Field of Search ................................... 32/63, 67, 74, 32/75, 78, 83, 84, 89; 327/170, 333, 376

(56) References Cited

U.S. PATENT DOCUMENTS

| | | | |
|---|---|---|---|
| 5,434,518 | * 7/1995 | Sinh et al. | 326/66 |
| 5,994,923 | * 11/1999 | Navabi | 326/89 |
| 6,008,667 | * 12/1999 | Fahrenbruch | 326/66 |

\* cited by examiner

*Primary Examiner*—Michael Tokar
*Assistant Examiner*—Vibol Tan
(74) *Attorney, Agent, or Firm*—Robert D. Atkins; Michael T. Wallace

(57) ABSTRACT

A circuit (10) for providing TTL logic signals at an output (24) employs dual pull up devices (20, 30) at the output. The first device (20) is a bipolar transistor that acts as an emitter-follower to quickly pull up the output in response to applied logic signals to drive the output to a logic one state. Thereafter, the second device (30) which is a MOS transistor is turned on to drive the magnitude of the high logic output signal to substantially $V_{CC}$, the positive power supply voltage supplied to the circuit (10).

27 Claims, 1 Drawing Sheet

CIRCUIT AND METHOD FOR A TRANSISTOR-TRANSISTOR LOGIC (TTL) COMPATIBLE OUTPUT DRIVE

BACKGROUND OF THE INVENTION

The present invention relates, in general, to logic circuits and, more particularly, to a relatively high speed output drive circuit compatible with Emitter-Coupled Logic (ECL) to Transistor-Transistor Logic (TTL) translator circuits for boosting the output high voltage ($V_{OH}$) to nearly the positive supply rail.

ECL-to-TTL translator logic circuits are well known in the art. For example, U.S. Pat. No. 4,939,393 describes a single power supply PECL to TTL translator circuit of the type to which the present invention is related. The '393 translator circuit uses a NPN bipolar output drive transistor for speed to minimize the propagation time delay of the circuit as the output transitions from a low output voltage to a high output voltage. Thus, as the NPN transistor is rendered conductive it sources current to the output of the circuit for driving the output positive.

Although the above described prior art circuit works quite well with positive power supply voltages equal to or greater than five volts, a problem is encountered as the power supply voltage is reduced, for example, to a magnitude of three (3) volts, which is required in some logic circuits of the type described above. At best, prior art circuits using a NPN bipolar output transistor can pull $V_{OH}$ to within only a base-emitter voltage, $V_{BE}$, of the positive power supply voltage. If, for example, the power supply voltage is 3.0 volts and $V_{BE}$ is typically 0.9 volts, $V_{OH}$ can only be pulled up to approximately 2.1 volts. This condition will not meet the Joint Electron Device Engineering Council (JEDEC) specification of $V_{OH}$ being equal to or greater than 2.4 volts with VEE=0 VDC and $V_{CC} \geq 3.0$ VDC.

Hence, a need exists for a high speed ECL to TTL translator circuit in which the output drive circuitry is capable of meeting the JEDEC TTL $V_{OH}$ specification of $\geq 2.4$V with $V_{CC} \geq 3.0$V and VEE+0V.

BRIEF DESCRIPTION OF THE DRAWINGS

The sole FIGURE is a simplified schematic diagram of an output drive circuit compatible for use as a TTL output circuit in accordance with the present invention.

DETAILED DESCRIPTION OF THE DRAWING

Figure 1:
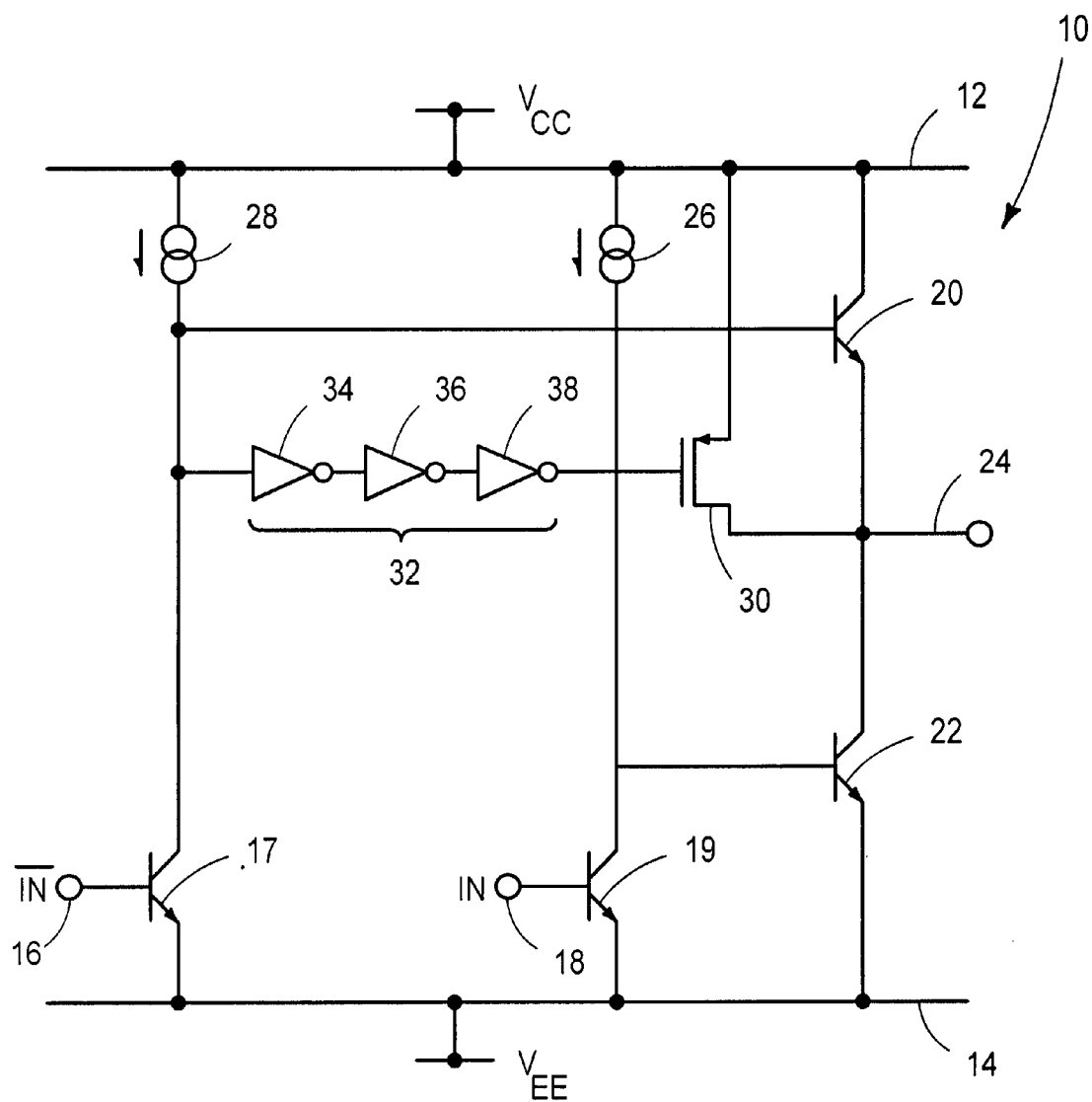

Turning to the FIGURE there is illustrated output circuit 10 of the preferred embodiment that may be incorporated into a typical PECL to TTL translator circuit and which is suited to be manufactured in an integrated circuit using conventional processes. Circuit 10 is illustrated as being operated by a single positive power supply, the positive operating potential, $V_{CC}$, being applied to rail 12 while, $V_{EE}$, ground operating potential, is applied to rail 14.

Circuit 10 is driven by complementary TTL logic level signals that are applied to input 16 and 18 as is understood. The complementary TTL logic signals may be supplied from a translator circuit portion of a known ECL to TTL translator circuit. For example, the ECL to TTL translator circuit portion of the aforementioned '393 patent may be used to provide the input TTL logic signals to circuit 10. Circuit 10 can be operated using a single positive power supply wherein VCC (the positive supply voltage) is approximately equal to or greater than 3.0 VDC and VEE is equal to 0 VDC while meeting the 2.4 VDC JEDEC specification as mentioned earlier.

Complementary logic input signals IN and $\overline{\text{IN}}$ are applied at input 16 and 18 respectively for driving circuit 10. Input 16 is coupled to the base electrode of NPN bipolar transistor 17 while its emitter electrode is coupled to rail 14. Similarly, input 18 is coupled to the base electrode of NPN bipolar transistor 19 having its emitter electrode coupled to transistor 19. Output 24 of circuit 10 is coupled both to the emitter electrode of emitter-follower pull up transistor 20 and the collector electrode of pull down transistor 22. Transistors 20 and 22 are shown as being bipolar NPN transistors. The collector electrode of transistor 20 is returned to positive rail 12 to which $V_{CC}$ is supplied while the emitter electrode of transistor 22 is returned to $V_{EE}$, ground reference, at ground rail 14.

The collector electrode of transistor 17 and the base electrode of pull up transistor 20 are coupled to current source 28. Likewise the collector electrode of transistor 19 and base electrode of transistor 22 are coupled to current source 26. A novel PMOS transistor 30 is illustrated for boosting $V_{OH}$ of TTL output circuit 10 to substantially $V_{CC}$ as will be explained. The gate or control electrode of transistor 30 is driven by current build up circuitry 32 the latter of which is coupled between the gate of transistor 30 and the collector electrode of transistor 17. The source and drain electrodes of transistor 30 are coupled to rail 12 and output 24 respectively. Current build up circuit 32 utilizes inverters 34, 36, and 38 coupled in series between the collector of transistor 17 and the gate electrode of transistor 30. Transistors 20 and 30 act as dual pull up devices on the output of circuit 10.

In operation, whenever pull down transistor 22 is turned on by current source 26 driving its base, the output of TTL output circuit 10 is driven low as the transistor sinks current from output 24. Transistor 22 is turned on or rendered conductive by transistor 19 being rendered non-conductive which occurs whenever logic signal IN is in a low logic level state. Concurrently, logic signal $\overline{\text{IN}}$, which is the complement of logic signal IN, is in a high logic level state thereby turning on transistor 17 which pulls its collector electrode low and substantially sinks all of the current supplied by current source 28. Hence, pull up transistor 20 is turned off. Additionally, the low voltage at the collector of transistor 17 is translated via build up circuit 32 to a high level sufficient to pull the gate of transistor 30 high. Transistor 30 is therefor turned off during the time that transistor 22 is sinking current from output 24.

When the respective logic level states of the complementary input logic signals supplied to inputs 16 and 18 change to opposite states, transistor 17 switches states and will be turned off while transistor 19 switches states and is turned on. Transistor 19 then sinks substantially all of the current supplied by current source 26 inhibiting base current drive to transistor 22. Thus, transistor 22 is turned off. Simultaneously, pull up transistor 20 is turned on as base current drive is provided from current source 28 with transistor 17 being turned off. When turned on, transistor 20 sources current to output 24 to a load (not shown) causing the voltage thereat to rise toward $V_{CC}$.

Because of the propagation delay through current build up circuit 32, transistor 20 is turned on prior to transistor 30. However, once the voltage at the gate of transistor 30 is forced low with respect to the voltage at its source, transistor 30 turns on. If the drain-to-source "on" resistance, $r_{dson}$, of transistor 30 is minimized, transistor 30 can drive or "pull up" output 24 to substantially $V_{CC}$. Hence, bipolar pull up transistor 20 is utilized for its speed to minimize the propagation time delay between switching the output level state at output 24 in response to the logic input signals while PMOS transistor 30 drives or pulls the output voltage to the positive rail voltage.

Inverting circuits 34, 36, and 38 may be realized by using conventional CMOS inverters. Typically, each inverter is comprised of a PMOS and an NMOS transistor in which the gates thereof are coupled together to the input of the inverter while the drains are coupled together to the output of the inverter. The source of the PMOS transistor is coupled to the positive supply rail while the source of the NMOS transistor is returned to the ground reference rail. The sizing of the transistors of each CMOS inverter is progressively increased with respect to those of the preceding inverter. This minimizes the capacitive loading effect at the collector of transistor 17 to reduce delay time while providing sufficient drive to ensure the larger PMOS transistor 30 is turned on. Further, Current sources 26 and 28 are preferably PMOS transistor current sources which provide fast switching ability at output 24. This is due to the fact that the PMOS current source transistor provides constant current until the device enters its linear operating region. For example, when transistor 17 is turned off, current source 26, being a PMOS transistor current source provides a constant current drive to transistor 20 which is sufficient to reduce the effective capacitive loading occurring at the node connecting the collectors of transistors 17 and 20.

Hence, what has been described above is a relatively fast switching circuit suited to be utilized in TTL logic circuits for driving the output to substantially the positive rail supply voltage. In fact, the aforedescribed circuit using the novel dual pull up devices meets the JEDEC $V_{OH}$ specification of $\geq 2.4$ volts at 2 ma with $V_{EE}=0VDC$ and $V_{CC} \geq 3.0VDC$.

What is claimed is:

1. A circuit for use with a single positive voltage supply that is responsive to complementary logic signals applied thereto for providing an output logic signal at an output of the circuit, comprising:
   a MOS transistor responsive to the complementary logic signals being in said predetermined logic states for sourcing additional current to the output of the circuit pulling the magnitude of the output logic signal substantially to the magnitude of the positive voltage supply, having control, first, and second electrodes, said first electrode being coupled to a first terminal to which the positive voltage supply is provided, and said second electrode being coupled to the output of the circuit; and
   a current build up circuit coupled to said control electrode of said MOS transistor, said current build up circuit being responsive to the complementary logic signals being in said predetermined logic states for rendering said MOS transistor conductive and being responsive to the complementary logic signals being in opposite logic states for turning said MOS transistor off.

2. The circuit of claim 1, further comprising:
   a second bipolar transistor having control, first and second electrodes, said control electrode being coupled to a first input of the circuit for receiving one of the complementary logic signals, said first electrode being coupled to a second terminal to which is supplied a ground reference supply; and
   a first current supply coupled to said second electrode of said second bipolar transistor.

3. The circuit of claim 2 wherein said first bipolar transistor includes a control electrode coupled to said second electrode of said second bipolar transistor, a first electrode coupled to the output of the circuit, and a second electrode coupled to said first terminal.

4. The circuit of claim 3 wherein said current build up circuit comprises a plurality of CMOS inverting circuits coupled in series between said second electrode of said second bipolar transistor and said control electrode of said MOS transistor.

5. The circuit of claim 4 further comprising:
   a third bipolar transistor having control, first and second electrodes, said control electrode being coupled to a second input of the circuit for receiving the other one of the complementary input logic signals, said first electrode being coupled to said second terminal; and
   a second current supply coupled to said second electrode of said third bipolar transistor.

6. The circuit of claim 5 further comprising a fourth bipolar transistor having control, first and second electrodes, said control electrode being coupled to said second electrode of said third bipolar transistor, said first electrode being coupled to said second terminal, and said second electrode being coupled to the output of the circuit.

7. A Circuit for use within a transistor to transistor logic (TTL) circuit operated from a single positive power supply, comprising:
   a NPN transistor having its emitter coupled to an output of the TTL circuit, its collector coupled to a terminal for receiving the positive supply voltage, and a base;
   a current supply for providing a current at an output thereof, said output being coupled to said base of said NPN transistor;
   circuitry including a PMOS transistor having its gate coupled to said output of said current supply, its source coupled to said terminal and its drain coupled to said output of the TTL circuit, said PMOS transistor driving said output of the TTL circuit when conductive to a voltage within the base to emitter voltage of said NPN transistor; and
   a switching device for alternatively rendering said NPN and PMOS transistor conductive and non-conductive in response to logic signals applied thereto.

8. The circuitry of claim 7 wherein said circuitry including a PMOS transistor includes a current build up circuit coupled between said output of said current supply and said gate of the PMOS transistor, said voltage build up circuit providing sufficient voltage drive to said gate to ensure said PMOS transistor is render conductive and non-conductive.

9. The circuitry of claim 8 wherein said current build up circuit comprises a plurality of series coupled CMOS inverting circuits.

10. The circuitry of claim 9 wherein said switching device is comprised of another NPN transistor having a base to which said logic signals are applied, a collector coupled to said current supply, and an emitter coupled to a terminal for receiving ground reference potential.

11. A circuit responsive to an applied input signal for providing the high output voltage logic state at an output thereof, wherein the high output voltage logic state of which approaches a magnitude of a positive power supply voltage applied thereto, comprising:
    a NPN transistor having first, second and control electrodes, said first electrode being coupled to the output of the circuit, said second electrode being coupled to a first terminal to which is supplied the power supply voltage, and said control electrode being directly coupled to a node at which the input signal is applied; and
    a MOS transistor having first, second, and control electrodes, said first electrode being coupled to said first terminal, said second terminal being coupled to the output of the circuit, and said control electrode being coupled to said node.

12. The circuit of claim 11 further including current build up circuitry coupled between said node and said control electrode of said MOS transistor.

13. The circuit of claim 12 wherein said voltage build up circuitry comprises a plurality of series coupled CMOS inverters.

14. The circuit of claim 13 further including:
   another NPN transistor having first, second, and control electrodes, said first electrode coupled to a second terminal to which is supplied ground reference supply, said second electrode being coupled to said node, and said control electrode receiving the logic signal; and
   a first current supply coupled between said first terminal and said node.

15. The circuit of claim 14 further including:
   yet another NPN transistor having first, second, and control electrodes, said first electrode being coupled to said second terminal, said second electrode being coupled to the output of the circuit, and said control electrode being coupled to another node;
   a second current supply coupled between said first terminal and said another node; and
   still another NPN transistor having first, second, and control electrodes, said first electrode being coupled to said second terminal, said second electrode being coupled to said another node, and said control electrode receiving an additional logic signal that is the complement of the logic signal supplied to said another NPN transistor.

16. A drive circuit, comprising:
   a first transistor having a control terminal responsive to a first input signal, a first conduction terminal coupled to a first power supply conductor, and a second conduction terminal coupled to an output of the drive circuit for providing a first drive signal;
   a propagation delay having an input coupled for receiving the first input signal;
   a second transistor having opposite polarity of the first transistor, having a control terminal coupled to an output of the propagation delay, a first conduction terminal coupled to the first power supply conductor, a second conduction terminal coupled to the output of the drive circuit for providing an increased magnitude to the first drive signal, wherein the propagation delay circuit causes the second transistor to be rendered conductive after the first transistor is rendered conductive; and
   a third transistor having a control terminal responsive to a second input signal, a first conduction terminal coupled to the output of the drive circuit for providing a second drive signal, and a second conduction terminal coupled a second power supply conductor.

17. The drive circuit of claim 16, wherein the first transistor further comprises a bipolar transistor having a control terminal responsive to the first input signal, a first input conduction terminal coupled to the first power supply conductor, and a second conduction terminal coupled to the output of the drive circuit for providing the first drive signal.

18. The drive circuit of claim 16, wherein the propagation delay further comprises:
   a first inverter having an input coupled to the input of the propagation delay;
   a second inverter having an input coupled to an output of the first inverter; and
   a third inverter having an input coupled to an output of the second inverter and an output coupled to the output of the propagation delay.

19. The drive circuit of claim 16, wherein the second transistor further comprises a MOS transistor having a control terminal coupled to the output of the propagation delay, a first conduction terminal coupled to the first power supply conductor, and a second conduction terminal coupled to the output of the drive circuit for providing an increased magnitude to the first drive signal.

20. The drive circuit of claim 16, wherein the third transistor further comprises a bipolar transistor having a control terminal responsive to the second input signal, a first conduction terminal coupled to the coupled to the output of the drive circuit for providing the second drive signal, and a second conduction terminal coupled the second power supply conductor.

21. A circuit having an output for providing a logic signal, comprising:
   a pull-up drive circuit coupled to the output of the circuit for providing a first drive signal in response to a first input signal, the pull-up circuit including a first transistor having a control terminal coupled for receiving the first input signal and first and second conduction terminals coupled for providing the first drive signal;
   a propagation delay having an input coupled for receiving the first input signal and providing a delayed signal after a predetermined time delay; and
   a boost circuit having an input coupled for receiving the delayed signal and providing a boost signal to the output of the circuit for increasing magnitude of the first drive signal after the predetermined time delay, the boost circuit including a second transistor having opposite polarity of the first transistor and having a control terminal coupled for receiving the delayed signal and first and second conduction terminals for providing the boost signal.

22. The circuit of claim 21 further including a pull-down drive circuit coupled to the output of the circuit for providing a second drive signal in response to a second input signal.

23. The circuit of claim 22, wherein the pull-down drive circuit further comprises a bipolar transistor having a control terminal coupled for receiving the second input signal, a first conduction terminal coupled for providing the second drive signal in response to the second input signal, and a second conduction terminal coupled to a first power supply conductor.

24. The circuit of claim 21, wherein the first transistor further comprises an NPN bipolar transistor having a control terminal coupled for receiving the first input signal, a first conduction terminal coupled to a first power supply conductor, and a second conduction terminal coupled for providing the first drive signal in response to the first input signal.

25. The circuit of claim 21, wherein the propagation delay further comprises:
   a first inverter having an input coupled to the input of the propagation delay;

a second inverter having an input coupled to an output of the first inverter; and a third inverter having an input coupled to an output of the second inverter and an output coupled to an output of the propagation delay.

26. The circuit of claim 21, wherein the second transistor further comprises a p-channel MOS transistor having a control terminal coupled to an output of the propagation delay, a first conduction terminal coupled to a first power supply conductor, a second conduction terminal coupled for providing the boost signal.

27. A method of boosting an output signal, comprising:

providing an input signal to a control terminal of a first transistor to conduct the output signal via a conduction path of the first transistor;

delaying the input signal to provide a delayed input signal; and providing the delayed input signal to a control terminal of a second transistor of opposite polarity to the first transistor to conduct a boost signal via a conduction path of the second transistor having a node common to the conduction path of the first transistor to boost the output signal.

* * * * *